(12) United States Patent
Miyazaki

(10) Patent No.: US 11,239,815 B2
(45) Date of Patent: Feb. 1, 2022

(54) RESONANCE MATCHING CIRCUIT

(71) Applicant: SUMIDA CORPORATION, Tokyo (JP)

(72) Inventor: Hiroyuki Miyazaki, Natori (JP)

(73) Assignee: SUMIDA CORPORATION

( * ) Notice: Subject to any disclaimer, the term of this patent is extended or adjusted under 35 U.S.C. 154(b) by 0 days.

(21) Appl. No.: 16/976,437

(22) PCT Filed: Feb. 25, 2019

(86) PCT No.: PCT/JP2019/006996
§ 371 (c)(1),
(2) Date: Aug. 27, 2020

(87) PCT Pub. No.: WO2019/181376
PCT Pub. Date: Sep. 26, 2019

(65) Prior Publication Data
US 2021/0119597 A1 Apr. 22, 2021

(30) Foreign Application Priority Data
Mar. 22, 2018 (JP) .............................. JP2018-055133

(51) Int. Cl.
*H03H 7/38* (2006.01)
*H02J 50/05* (2016.01)

(52) U.S. Cl.
CPC ............... *H03H 7/38* (2013.01); *H02J 50/05* (2016.02)

(58) Field of Classification Search
CPC .... H02M 1/0058; H02M 7/4815; H02M 1/12; H02M 3/337; H02M 7/493; H02M 7/48; H02M 7/5387; H02M 1/0048; H02M 1/007; H02M 3/335; H02M 3/3376; H02M 5/4585; H02M 7/538; H02M 3/155; H02M 3/33576; H02J 50/12; H02J 50/40
See application file for complete search history.

(56) References Cited

U.S. PATENT DOCUMENTS

2015/0326141 A1 11/2015 Takahashi et al.
2016/0126754 A1 5/2016 Ichikawa et al.
(Continued)

FOREIGN PATENT DOCUMENTS

JP 201597433 A 5/2015
JP 201770055 A 4/2017
WO 2015186581 A1 12/2015

OTHER PUBLICATIONS

European Search Report for Application No. 19770892 dated Mar. 9, 2021 (8 pages).
(Continued)

*Primary Examiner* — John W Poos
(74) *Attorney, Agent, or Firm* — Harness, Dickey & Pierce, P.L.C.

(57) ABSTRACT

A resonance matching circuit used in a power supply system that supplies electric power by an electric field coupling method is provided. The resonance matching circuit includes an inverter circuit that functions as a voltage source, parallel transformer devices that are connected in parallel to the inverter circuit and transmit a current supplied from the inverter circuit, and a timing adjustment circuit that is located between the inverter circuit and the parallel transformer devices and adjusts an input timing of a pulse current supplied by the inverter circuit.

6 Claims, 2 Drawing Sheets

(56) References Cited

U.S. PATENT DOCUMENTS

2017/0310162 A1    10/2017  Matsumoto et al.
2018/0183351 A1*    6/2018  Yamada .................. H02M 5/44

OTHER PUBLICATIONS

Hisamoto, Masaaki, et al., "High Frequency Power Supply Heating Circuit", Fuji Time Report, vol. 71, No. 5, pp. 266-273, 1998.
International Search Report issued in PCT/JP2019/006996 (in English and Japanese), dated Apr. 23, 2019; ISA/JP.

* cited by examiner

RESONANCE MATCHING CIRCUIT

CROSS REFERENCE TO RELATED APPLICATIONS

This application is a U.S. National Phase application of International Application No. PCT/JP2019/006996, filed on Feb. 25, 2019 and published in Japanese as WO 2019/181376 A1 on Sep. 26, 2019 and claims priority to Japanese Patent Application No. 2018-055133, filed on Mar. 22, 2018. The entire disclosures of the above applications are expressly incorporated by reference herein.

BACKGROUND

Technical Field

The present invention relates to a resonance matching circuit.

Related Art

An inverter circuit is a device that converts direct current power into alternating current. The inverter circuit includes a voltage type inverter circuit and a current type inverter circuit. The voltage type inverter circuit operates as a voltage source for a load, and the current type inverter circuit operates as a current source for a load. Such an inverter circuit is described in Masaaki Hisamoto, Yutaka Ito, Toshihiro Nomura, "High Frequency Power Supply Heating Circuit", Fuji Jihou, pp. 266-273, vol. 71, No. 5, 1998, for example.

"High Frequency Power Supply Heating Circuit" describes as follows: the voltage type inverter circuit and the current type inverter circuit are combined with a resonance circuit, a series resonance circuit is preferable as a resonance circuit of the voltage type inverter circuit, and a parallel resonance circuit is preferable as a resonance circuit of the current type inverter circuit.

However, in the field of portable and running electric devices such as portable terminal devices, robots, and electric vehicles, it has been considered to use a voltage type inverter circuit for a charging device that performs contactless charging. It is known that, when the voltage type inverter circuit is used and a series resonance circuit is provided on a side of a load, an electric field coupling unit connected to the load is easily affected by environmental changes. Note that, in this case, the environment of the electric field coupling unit refers to a state of contact between an electric device serving as a load and the electric field coupling unit, or a charging state of a portable terminal device or the like. Specifically, if the state of contact between the electric device and the electric field coupling unit is inappropriate, no load may be caused, and if the electric device or the like has a very large amount of charge, an overload may be caused.

From the above point, it is conceivable to provide a parallel resonance circuit on the side of the load connected to the voltage type inverter circuit. However, there occurs a problem in that, when the parallel resonance circuit is connected, the voltage type inverter circuit cannot perform a zero-cross operation and thus transmission efficiency decreases. Note that the zero-cross operation is an operation of turning on and off an inverter switch element at a timing when a current on the load side becomes zero, which is advantageous for improving inverter conversion efficiency and preventing noise generation.

The present invention has been made in view of the above points, and relates to a resonance matching circuit that does not decrease transmission efficiency of a voltage type inverter circuit even when the resonance matching circuit is connected to a parallel resonance circuit.

SUMMARY

One form of a resonance matching circuit according to the present invention is a resonance matching circuit used in a power supply system that supplies electric power by an electric field coupling method, and includes an inverter circuit that functions as a voltage source, parallel transformer devices that are connected in parallel to the inverter circuit and transmit a current supplied from the inverter circuit, and a timing adjustment circuit that is located between the inverter circuit and the parallel transformer devices and adjusts an input timing of a pulse current supplied by the inverter circuit.

Effect of the Invention

According to the present invention, it is possible to provide a resonance matching circuit that does not decrease transmission efficiency of a voltage type inverter circuit even when the resonance matching circuit is connected to a parallel resonance circuit.

DETAILED DESCRIPTION

Figure 1:
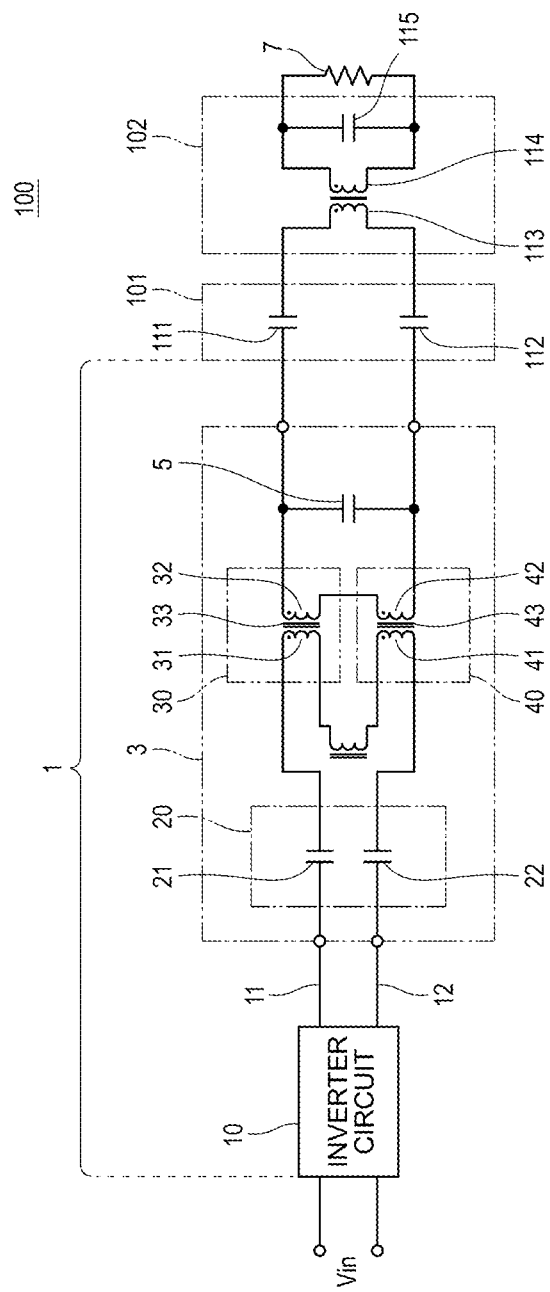
FIG. 1 is a diagram for describing a power supply system to which a resonance matching circuit according to an embodiment of the present invention is applied.

Hereinafter, an embodiment of the present invention will be described with reference to the drawings. Note that, in all the drawings, similar components are denoted by similar reference numerals, and overlapping description will not be repeated. Furthermore, a circuit shown in the present embodiment is an example in which the present embodiment is embodied, and addition and substitution of a circuit element are appropriately permitted without departing from the concept of the present invention.

Overview

FIG. 1 is a diagram for describing a power supply system 100 to which a resonance matching circuit according to the present embodiment is applied. However, the power supply system 100 shown in FIG. 1 does not include a load 7.

The power supply system 100 includes a resonance matching circuit 1, a matching unit 3, an electric field coupling unit 101, and a load matching circuit 102. In such a configuration, an inverter circuit 10 and the matching unit 3 constitute the resonance matching circuit 1 of the present embodiment.

The electric field coupling unit 101 and the load matching circuit 102 are located between the resonance matching circuit 1 and the load 7, and are parts that supply power from the resonance matching circuit 1 to the load 7. The electric field coupling unit 101 includes capacitive elements 111 and 112 connected in series to each other. In addition, the load matching circuit 102 includes a primary coil 113 that constitutes an LC circuit together with the capacitive elements 111 and 112, a secondary coil 114 that forms a transformer device together with the primary coil 113, and a capacitive element 115 that constitutes an LC circuit together with the secondary coil 114.

The resonance matching circuit 1 is a circuit used in a power supply system that supplies electric power by an electric field coupling method. The electric field coupling method is a method of supplying electric power from a device on a power-supply side to a device on a power-supplied side in a wireless and contactless manner. Power supply in such a method is performed in the field of portable communication terminals, self-propelled robots, and the like.

Figure 2:
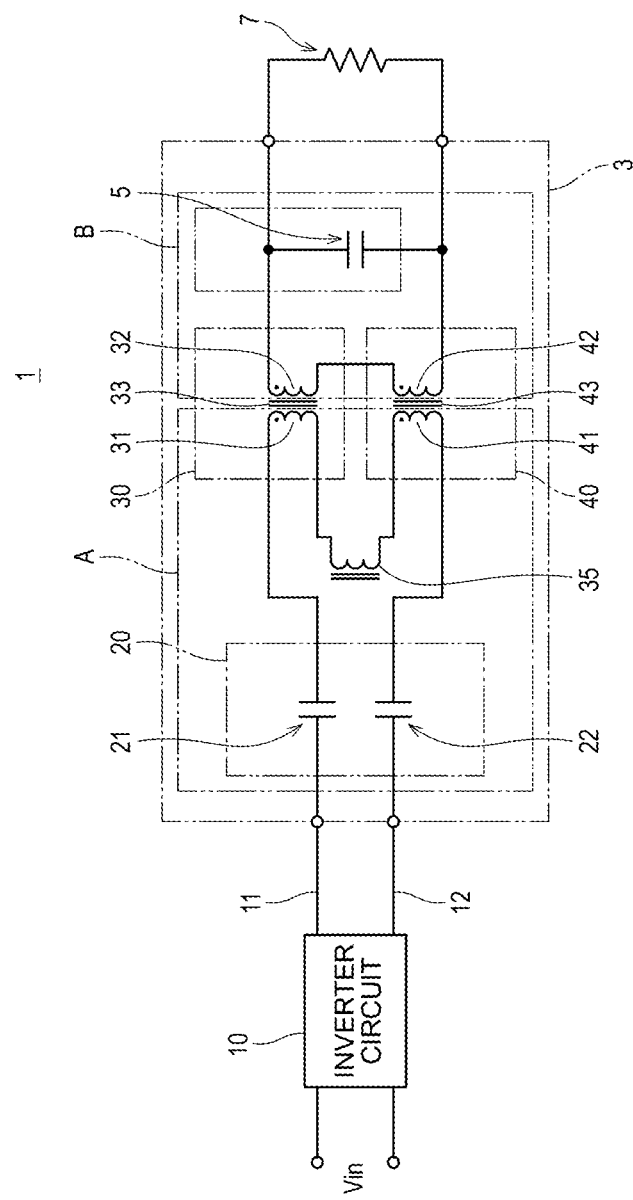
FIG. 2 is a diagram for describing the resonance matching circuit shown in FIG. 1.

FIG. 2 is a diagram for describing the resonance matching circuit 1 shown in FIG. 1, and shows a configuration of the power supply system 100 shown in FIG. 1 excluding the electric field coupling unit 101 and the load matching circuit 102. The above configuration will be described below.

Furthermore, the resonance matching circuit 1 includes the inverter circuit 10 and the matching unit 3 connected to the inverter circuit 10. The matching unit 3 includes parallel transformer devices 30 and 40 that are connected in parallel to the inverter circuit 10 and transmit a current supplied from the inverter circuit 10, and a first capacitive element 21 and a second capacitive element 22 that are located between the inverter circuit 10 and the parallel transformer devices 30 and 40 and are series capacitive elements for adjusting an input timing of a pulse current supplied by the inverter circuit 10. The first capacitive element 21 and the second capacitive element 22 function as a timing adjustment circuit 20 of the present embodiment.

The above configuration will be described below in order.

Inverter Circuit

As shown in FIGS. 1 and 2, the resonance matching circuit 1 of the present embodiment includes the inverter circuit 10. A direct current voltage (Vin) is input to the inverter circuit 10 from a power supply not shown in the drawings, and the inverter circuit 10 converts the direct current voltage into a pulse current and outputs the pulse current. The generation of the pulse current is controlled by turning on and off a voltage signal. The inverter circuit 10 is a voltage switch/current resonance type inverter circuit that functions as a voltage source.

Parallel Transformer Device

The parallel transformer device 30 includes a primary coil 31 (first primary coil) and a secondary coil 32. When a current flows through the primary coil 31, a magnetic field is generated, and an electromotive force is generated in the secondary coil 32 by mutual induction. The primary coil 31 and the secondary coil 32 are wound around a core material 33 having a high dielectric constant, and boost a voltage in accordance with a ratio of the number of turns. In addition, the parallel transformer device 40 includes a primary coil 41 (second primary coil) and a secondary coil 42. When a current flows through the primary coil 41, a magnetic field is generated, and an electromotive force is generated in the secondary coil 42 by mutual induction. The primary coil 41 and the secondary coil 42 are wound around a core material 43 having a high dielectric constant, and boost a voltage in accordance with a ratio of the number of turns.

The parallel transformer devices 30 and 40 as described above need to maintain a high voltage in the matching unit 3. In the present embodiment, from a viewpoint of pressure resistance, the parallel transformer device has two systems of the parallel transformer devices 30 and 40.

That is, in the present embodiment, the inverter circuit 10 includes a first terminal 11 and a second terminal 12 that output electric power, and the parallel transformer devices 30 and 40 described above and the timing adjustment circuit 20 are configured as two systems. Furthermore, the first capacitive element 21, which is the series capacitive element, the primary coil 31, and the secondary coil 32 described above are used as a system on a side of the first terminal 11, and the second capacitive element 22, which is the series capacitive element, and the parallel transformer device 40 are connected to a side of the second terminal 12 similarly. In the present embodiment, the second capacitive element 22 and the parallel transformer device 40 described above are used as a system of the second terminal 12. Note that, here, since the resonance matching circuit 1 forms a parallel circuit using the inverter circuit 10 as a voltage source, the first terminal 11 and the second terminal 12 are electrically connected. In the present embodiment, a portion of the circuit from the inverter circuit 10 to the load 7 is divided into the side of the first terminal 11 and the side of the second terminal 12, each of which is described as a "system".

As described above, the timing adjustment circuit 20 of the present embodiment includes the first capacitive element 21 connected in series to the first terminal 11 and the second capacitive element 22 connected in series to the second terminal 12. Furthermore, the parallel transformer device 30 includes the primary coil 31 connected in series to the first capacitive element 21. The parallel transformer device 40 includes the primary coil 41 located between the primary coil 31 and the second capacitive element 22 and connected in series to the primary coil 31 and the second capacitive element 22. In addition, the parallel transformer device 40, similarly to the parallel transformer device 30, includes the secondary coil 42 that causes mutual induction with the primary coil 41. Both the primary coil 41 and the secondary coil 42 of the parallel transformer device 40 are wound around the core material 43.

Adjustment Coil

Furthermore, in the present embodiment, as shown in FIG. 2, an adjustment coil 35 is provided between the primary coil 31 and the primary coil 41. The adjustment coil 35 is a coil that adjusts a resonance frequency of a resonance circuit A including the first capacitive element 21, the second capacitive element 22, which are series capacitors, and the primary coils 31 and 41, in accordance with a resonance frequency of a resonance circuit B including the secondary coils 32 and 42 and a parallel capacitor 5 that is parallel to the secondary coils 32 and 42.

Note that, the adjustment coil 35 "adjusting" the resonance frequency here means that the resonance frequency of the resonance circuit A is different between a case where the adjustment coil 35 is included and a case where the adjustment coil 35 is not included. In the present embodiment, the resonance frequency of the resonance circuit A is adjusted so that efficiency of the inverter circuit 10 is increased.

That is, in the present embodiment, in the matching unit 3, a circuit directly connected to the voltage source is the resonance circuit A, and a circuit magnetically connected to the resonance circuit A is the resonance circuit B. The first capacitive element 21, the second capacitive element 22, the primary coil 31, the adjustment coil 35, and the primary coil 41 constitute an LC circuit in the resonance circuit A, and the resonance circuit A resonates at a predetermined resonance frequency determined by characteristics or the like of each element that constitutes the LC circuit. On the other hand, in the resonance circuit B, the secondary coil 32, the secondary coil 42, and the parallel capacitor 5 constitute an LC circuit, and the resonance circuit B resonates at a predetermined resonance frequency. The adjustment coil 35 that does not contribute to mutual induction is provided for adjusting the resonance frequency of the resonance circuit A in accordance with the resonance frequency of the resonance circuit B.

The resonance frequency is adjusted so that transmission efficiency of the inverter circuit 10 is increased. The inverter circuit 10 preferably operates in a so-called leading phase, in which a phase of a current leads a phase of a voltage, so that the transmission efficiency is increased. The adjustment coil 35 adjusts the resonance frequency of the resonance circuit A so that the phase of the current of the inverter circuit 10 leads the phase of the voltage of the inverter circuit 10.

When the inverter circuit 10 is operated in the leading phase, the resonance frequency of the resonance circuit A of the resonance matching circuit 1 is designed to be slightly lower than a target frequency, and the resonance frequency of the resonance circuit B is designed to be slightly higher than the target frequency. It is possible to achieve such a design, for example, by providing the adjustment coil 35 between the primary coil 31 and the primary coil 41.

According to the adjustment coil 35 of the present embodiment, for example, the resonance frequency of the resonance circuit A can be set to 1.95 MHz to 1.97 MHz with respect to the target resonance frequency of 2 MHz. At this time, the resonance frequency of the resonance circuit B is preferably about 2.01 MHz.

Note that the present embodiment is not limited to the adjustment coil 35 setting the resonance frequencies of the resonance circuit A and the resonance circuit B to the above numerical values. The resonance frequency may be adjusted, for example, so that the resonance frequency of the resonance circuit A is a frequency obtained by reducing the target frequency by 10%, and more preferably, the resonance frequency of the resonance circuit A is a frequency obtained by reducing the target frequency by 5%.

Furthermore, the adjustment coil is not limited to being provided between the primary coil 31 and the primary coil 41 like the adjustment coil 35. The adjustment coil can be provided, for example, in at least one of locations between the primary coil 31 and the primary coil 41, between the first capacitive element 21 and the primary coil 31, and between the primary coil 41 and the second capacitive element 22. As the adjustment coil, for example, a known choke coil can be used.

The resonance circuit A and the resonance circuit B of the present embodiment act on the inverter as follows. That is, when the load 7 is heavy (=a load Z is low), a parallel resonance Q of the resonance circuit B decreases and a series resonance Q of the resonance circuit A increases, so that the inverter operates as a series resonance load. Therefore, the voltage type inverter can be driven by zero-cross switching, and high conversion efficiency can be achieved. Furthermore, when the load 7 is light (=the load Z is high), the parallel resonance Q of the resonance circuit B increases and the series resonance Q of the resonance circuit A decreases, so that the inverter operates as a parallel resonance load. In this case, the voltage type inverter is not driven by the zero-cross switching, but a current flowing through the inverter is low, and thus a large power loss does not occur.

Operation

Next, an operation of the resonance matching circuit 1 of the present embodiment will be described.

In the resonance matching circuit 1 shown in FIG. 2, a direct current voltage is input to the inverter circuit 10 from a direct current power supply not shown in the drawings. The inverter circuit 10 converts the input direct current voltage into a pulse current having a rectangular wave. The conversion into the pulse current is performed so that a frequency of the pulse current coincides with the resonance frequency of the resonance circuit A.

The pulse current is input to the timing adjustment circuit 20 of the matching unit 3. At this time, in the timing adjustment circuit 20, the first capacitive element 21 and the second capacitive element 22 are repeatedly charged and discharged by the current supplied from the inverter circuit 10, the voltage increases during charging, and the voltage decreases during discharging. As a result, the inverter circuit 10 can perform a zero-cross operation by matching an output timing (on-timing) of the pulse current with a time of discharging of the first capacitive element 21 and the second capacitive element 22 (immediately before a start of charging), and thus can prevent generation of a switching noise and an inrush current and achieve efficient operation.

An electric charge discharged from the first capacitive element 21 and the second capacitive element 22 flows, as a current, into the primary coil 31, the adjustment coil 35, and the primary coil 41. Since this current flows intermittently in accordance with the charging and discharging of the first capacitive element 21 and the second capacitive element 22, a magnetic field is generated in the primary coil 31, the adjustment coil 35, and the primary coil 41 so as to prevent a change in the current, and an electromotive force is generated in the secondary coil 32 and the secondary coil 42 by the magnetic field. Since the resonance circuit B has the highest voltage at the resonance frequency, the parallel transformer devices 30 and 40 can obtain a high boosting effect.

The voltage boosted by the parallel transformer devices 30 and 40 is supplied to the load 7 in a contactless manner.

Experimental Result

The inventor of the present invention conducted an experiment using the power supply system 100 shown in the resonance matching circuit 1 to confirm the transmission efficiency under a low load and high load. The results of the experiment will be described below.

Table 1 is a table showing the transmission efficiency of the power supply system 100 under an overload. Table 2 is a table showing the transmission efficiency of the power supply system 100 under no load.

In Tables 1 and 2, "frequency" is a frequency F (MHz) of the pulse current output by the inverter circuit 10. "Inverter circuit input" is a voltage DCV (V) and a current DCI (A) input to the inverter circuit 10 from a direct current power supply not shown in the drawings. An output electric power Pout (W) is electric power output from the power supply system 100, and an input electric power Pin (W) is electric power input to the power supply system 100.

TABLE 1

| Frequency F (MHz) | Inverter circuit input | | Input electric power Pin (W) | Output electric power Pout (W) | Transmission efficiency % |
|---|---|---|---|---|---|
| | DCV (V) | DCI (A) | | | |
| 2.0005 | 370.00 | 2.630 | 973.00 | 906.26 | 93.1 |
| 2.0009 | 370.00 | 2.640 | 976.80 | 908.52 | 93.0 |
| 2.0013 | 368.00 | 2.650 | 975.20 | 907.39 | 93.0 |
| 2.0012 | 368.00 | 2.660 | 978.88 | 906.26 | 92.6 |

TABLE 2

| Frequency F | Inverter circuit input | | Input electric power | Output electric power | Transmission efficiency |
|---|---|---|---|---|---|
| (MHz) | DCV (V) | DCI (A) | Pin (W) | Pout (W) | % |
| 1.9990 | 384.00 | 0.300 | 737.00 | 0.00 | 0.0 |
| 2.0021 | 385.00 | 0.300 | 735.80 | 0.00 | 0.0 |
| 2.0019 | 387 00 | 0.300 | 735.20 | 0.00 | 0.0 |
| 2.0022 | 387.00 | 0.310 | 737.00 | 0.00 | 0.0 |

According to Table 1, it can be seen that the power supply system 100 of the present embodiment can obtain the transmission efficiency of 92.6% to 93.1% when the load 7 is relatively large. The transmission efficiency of the circuit in which the parallel transformer devices 30 and 40 were directly connected to the voltage type inverter circuit 10 was about 70%. From this result, it is apparent that the resonance matching circuit 1 of the present embodiment including the timing adjustment circuit 20 has an effect of improving operation efficiency of the inverter circuit 10.

Furthermore, according to Table 2, it can be seen that the power supply system 100 has the transmission efficiency of 0 when there is no load. However, in such a region, since the output electric power is small in the first place, the decrease in the transmission efficiency does not pose a problem.

As described above, the present embodiment can implement a resonance matching circuit capable of electric field coupling that is hardly affected by load fluctuations by using a voltage type inverter circuit and a parallel transformer device. Furthermore, in such a configuration, the present embodiment does not lower efficiency of the voltage type inverter circuit and can maintain efficiency similar to the voltage type inverter circuit combined with a series resonance coil.

The above embodiment and example include the following technical ideas.

(1) A resonance matching circuit used in a power supply system that supplies electric power by an electric field coupling method, the resonance matching circuit comprising: an inverter circuit that functions as a voltage source; parallel transformer devices that are connected in parallel to the inverter circuit and transmit a current supplied from the inverter circuit; and a timing adjustment circuit that is located between the inverter circuit and the parallel transformer devices and adjusts an input timing of a pulse current supplied by the inverter circuit.

(2) The resonance matching circuit according to (1), wherein the timing adjustment circuit includes a series capacitive element connected in series to the inverter circuit.

(3) The resonance matching circuit according to (2), wherein each of the parallel transformer devices includes a primary coil and a secondary coil, and the resonance matching circuit further comprises an adjustment coil that adjusts a resonance frequency of a first circuit including the series capacitive element and the primary coils in accordance with a resonance frequency of a second circuit including the secondary coils and a parallel capacitor parallel to the secondary coils.

(4) The resonance matching circuit according to (3), wherein the adjustment coil adjusts the resonance frequency of the first circuit so that a phase of a current of the inverter circuit leads a phase of a voltage of the inverter circuit.

(5) The resonance matching circuit according to (3) or (4), wherein the inverter circuit includes a first terminal and a second terminal that output electric power, the timing adjustment circuit includes, as the series capacitive element, a first capacitive element connected in series to the first terminal and a second capacitive element connected in series to the second terminal, and the parallel transformer devices include a first primary coil connected in series to the first capacitive element, and a second primary coil that is located between the first primary coil and the second capacitive element and connected in series to the first primary coil and the second capacitive element.

(6) The resonance matching circuit according to (5), wherein the adjustment coil is provided in at least one of locations between the first capacitive element and the first primary coil, between the first primary coil and the second primary coil, and between the second primary coil and the second capacitive element.

The invention claimed is:

1. A resonance matching circuit used in a power supply system that supplies electric power by an electric field coupling method, the resonance matching circuit comprising:
   an inverter circuit configured to perform as a voltage source;
   parallel transformer devices that are connected in parallel to the inverter circuit and transmit a current supplied from the inverter circuit;
   a timing adjustment circuit that is located between the inverter circuit and the parallel transformer devices and adjusts an input timing of a pulse current supplied by the inverter circuit; and
   an adjustment coil,
   wherein the timing adjustment circuit includes a series capacitive element connected in series to the inverter circuit,
   each of the parallel transformer devices includes a primary coil and a secondary coil, and
   the adjustment coil adjusts a resonance frequency of a first circuit including the series capacitive element and the primary coils in accordance with a resonance frequency of a second circuit including the secondary coils and a parallel capacitor parallel to the secondary coils.

2. The resonance matching circuit according to claim 1, wherein
   the adjustment coil adjusts the resonance frequency of the first circuit so that a phase of a current of the inverter circuit leads a phase of a voltage of the inverter circuit.

3. The resonance matching circuit according to claim 1, wherein
   the inverter circuit includes a first terminal and a second terminal that output electric power, the timing adjustment circuit includes, as the series capacitive element, a first capacitive element connected in series to the first terminal and a second capacitive element connected in series to the second terminal, and
   the parallel transformer devices include a first primary coil connected in series to the first capacitive element, and a second primary coil located between the first primary coil and the second capacitive element and connected in series to the first primary coil and the second capacitive element.

4. The resonance matching circuit according to claim 3, wherein
   the adjustment coil is provided in at least one of locations between the first capacitive element and the first primary coil, between the first primary coil and the second primary coil, and between the second primary coil and the second capacitive element.

5. The resonance matching circuit according to claim 2, wherein
  the inverter circuit includes a first terminal and a second terminal that output electric power,
  the timing adjustment circuit includes, as the series capacitive element, a first capacitive element connected in series to the first terminal and a second capacitive element connected in series to the second terminal, and
  the parallel transformer devices include a first primary coil connected in series to the first capacitive element, and a second primary coil located between the first primary coil and the second capacitive element and connected in series to the first primary coil and the second capacitive element.

6. The resonance matching circuit according to claim 5, wherein
  the adjustment coil is provided in at least one of locations between the first capacitive element and the first primary coil, between the first primary coil and the second primary coil, and between the second primary coil and the second capacitive element.

* * * * *